United States Patent
Thuerlemann

(10) Patent No.: US 7,146,718 B2
(45) Date of Patent: Dec. 12, 2006

(54) APPARATUS FOR MOUNTING SEMICONDUCTORS

(75) Inventor: Silvan Thuerlemann, Unteraegeri (CH)

(73) Assignee: ESEC Trading SA, Cham (CH)

( * ) Notice: Subject to any disclaimer, the term of this patent is extended or adjusted under 35 U.S.C. 154(b) by 211 days.

(21) Appl. No.: 10/845,050

(22) Filed: May 12, 2004

(65) Prior Publication Data

US 2005/0011067 A1 Jan. 20, 2005

(30) Foreign Application Priority Data

May 21, 2003 (CH) .................................... 0933/03

(51) Int. Cl.
*H05K 13/04* (2006.01)
(52) U.S. Cl. .................... 29/741; 29/740; 414/225.01; 414/744.8; 901/31
(58) Field of Classification Search ................. 29/739, 29/740, 741, 743; 414/222.01, 225.01, 715, 414/941, 744.8, 752.1; 901/17, 31, 12
See application file for complete search history.

(56) References Cited

U.S. PATENT DOCUMENTS

| | | | | |
|---|---|---|---|---|
| 4,018,342 A * | 4/1977 | Cuniberti et al. | ............ | 414/737 |
| 4,411,576 A * | 10/1983 | Smith et al. | ............ | 414/224.01 |
| 4,733,459 A * | 3/1988 | Tateno | ............ | 29/741 |
| 5,210,933 A | 5/1993 | Miyanishi et al. | ............ | 29/741 |
| 5,313,401 A * | 5/1994 | Kasai et al. | ............ | 700/160 |
| 6,171,049 B1 * | 1/2001 | Wirz et al. | ............ | 414/680 |
| 6,185,815 B1 | 2/2001 | Schindler | ............ | 29/740 |
| 6,579,057 B1 * | 6/2003 | Mimata et al. | ............ | 414/627 |
| 6,621,157 B1 * | 9/2003 | Wirz et al. | ............ | 257/692 |
| 6,637,100 B1 | 10/2003 | Lin et al. | ............ | 29/827 |
| 6,877,217 B1 * | 4/2005 | Mehdianpour et al. | ............ | 29/743 |
| 7,028,392 B1 * | 4/2006 | Schiebel | ............ | 29/740 |

FOREIGN PATENT DOCUMENTS

| | | |
|---|---|---|
| DE | 10055185 | 5/2002 |
| DE | 10055185 A1 * | 5/2002 |
| EP | 877544 | 11/1998 |
| FR | 2457057 * | 12/1980 |
| WO | 97/32460 | 9/1997 |
| WO | 00/51408 | 8/2000 |

OTHER PUBLICATIONS

Rotary Steam Engine, Oct. 9, 1999☐☐http://web.archive.org/web/19991009183654/http://www.spartacus.schoolnet.co.uk/TEXrotary.htm*
European International Search Report, EP 03101438, dated Oct. 15, 2003.

* cited by examiner

*Primary Examiner*—A. Dexter Tugbang
*Assistant Examiner*—Livius Radu Cazan
(74) *Attorney, Agent, or Firm*—Thelen Reid & Priest LLP; David B. Ritchie

(57) ABSTRACT

When mounting semiconductor chips, the semiconductor chips are presented on a wafer table where they are picked one after the other by a pick and place system, transported and placed onto a substrate that rests on a supporting surface of a substrate table. The wafer table is aligned diagonally to the supporting surface of the substrate table whereby part of the wafer table is located under the substrate table. The pick and place system comprises a shuttle with a swivel arm carrying a bondhead. The swivel arm is swivelled back and forth between two predetermined swivel positions whereby in the first swivel position a longitudinal axis of the swivel arm embraces the angle $\phi$ with the perpendicular to the supporting surface of the substrate table and whereby in the second swivel position the longitudinal axis of the swivel arm runs orthogonally to the supporting surface of the substrate table.

6 Claims, 2 Drawing Sheets

APPARATUS FOR MOUNTING SEMICONDUCTORS

PRIORITY CLAIM

Figure 1:
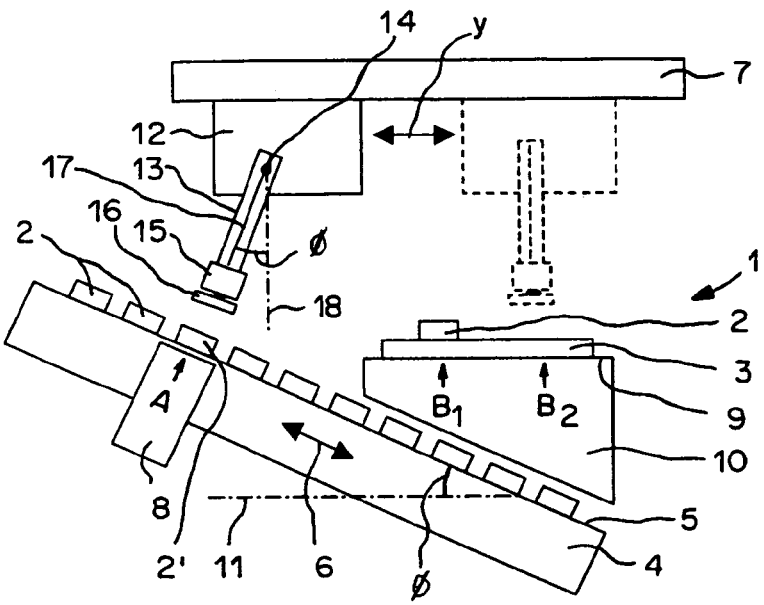

The present application claims priority under 35 U.S.C § 119 based upon Swiss Patent Application No. 2003 0933/03 filed on May 21, 2003.

FIELD OF THE INVENTION

The invention concerns an apparatus for mounting semiconductors.

BACKGROUND OF THE INVENTION

An apparatus for mounting semiconductors of this type is known in the art as a "Die Bonder". It serves to mount the numerous, uniform chips of a wafer that are located next to each other on a carrier, mostly a tape, one after the other onto a substrate, eg, a metallic leadframe. Co-ordinated with each Pick-and-Place movement of a chip gripper, a wafer table on which the chip carrier is located presents a next chip and the substrate is transported likewise in order to present a new substrate position at a second location. In order to pick and subsequently place the chip, the chip gripper can be raised and lowered either together with the entire Pick and Place system or independently in relation to the Pick and Place system.

Extremely high demands are placed on automatic assembly machines of this type. For the further processing of the mounted chips, they must be accurately positioned on the substrate which demands a correspondingly accurate reaching of the second location by the chip gripper and already demands the accurate reaching of the first location for picking the chip. On the other hand, high speed and short cycle times are required through which correspondingly high accelerations and forces of inertia occur at the moved parts.

Up to now, in order to produce the alternating movements of the chip gripper, various lever mechanisms have been applied some of which include crank guides. Because of the substantial lateral forces occurring at them, guides of this type are unfavourable for a precise movement process and have to be appropriately maintained. With another known mechanism, the chip gripper sits at the end of a lever that swivels back and forth, ie, it makes an arc-shaped movement corresponding to the swivel deflections of the lever each of which has to be stopped in the end positions whereby a strong tendency to oscillation exists. A disadvantage of such lever-operated mechanisms lies in that they only allow the transport of the chip along a fixed, predetermined path from a location A to a location B. Pick and Place systems with lever mechanisms are known for example from the patent documents EP 877,544, U.S. Pat. No. 6,185,815 and WO 97/32460.

Pick and Place systems are also known with which the chip gripper is driven by means of a toothed belt. The disadvantage here is the great inaccuracy in placing the chip onto the substrate.

On the one hand, in order to be able to mount the semiconductor chips quickly and accurately, the distance between the pick location and the mounting location should be short and, on the other hand, the mechanical construction should be simple. The Pick and Place system of EP 923,111 is indeed a simple and robust construction that enables a precise placing of the semiconductor chip onto the substrate but has the disadvantage that the space requirement continues to increase as the diameter of the wafers continues to increase. The equally known solution with which the substrate table and the wafer table are arranged one above the other has the disadvantage that, from the pick location to the mounting location, a large difference in height has to be overcome.

The Pick and Place system known from WO 97/32460 with which the wafer table is arranged orthogonally to the substrate table has the disadvantage that occasionally semiconductor chips that stick to the foil fall down and that the foil distorts as the result of the force of gravity acting upon the semiconductor chips so that the position of the semiconductor chip to be picked changes unintentionally. Furthermore, it can happen that now and then the foil inclines out of the vertical plane. In doing so, the corners or edges of neighbouring semiconductor chips that are only separated by small saw cuts could come into contact. In the worst case, such contacts can lead to corners or edges of the semiconductor chips breaking off which is known in the art as "Chipping".

BRIEF DESCRIPTION OF THE INVENTION

The object of the invention is to develop a Die Bonder with which the distance between the pick location and the mounting location of the semiconductor chip is short but which does not have the above-mentioned disadvantages.

With the mounting of semiconductor chips onto a substrate, the substrate is fed in steps by a transport system to a dispensing station where adhesive is applied and then to a bonding station where the next semiconductor chip is placed. The semiconductor chips stick on a foil (or tape) clamped in a frame and are presented on a so-called wafer table where they are picked one after the other by a system known as a pick and place system, transported and placed onto the substrate that lies on a supporting surface of a substrate table. The pick and place system comprises a bondhead with a chip gripper to pick up the semiconductor chips.

In accordance with the invention, with the semiconductor mounting apparatus the wafer table is aligned diagonally to the supporting surface of the substrate table at a predefined angle $\phi$ whereby part of the wafer table is located underneath the substrate table. The pick and place system comprises a shuttle with a swivel arm that carries the bondhead with the chip gripper. The swivel arm can be swivelled back and forth between two predetermined swivel positions whereby in the first swivel position, a longitudinal axis of the swivel arm includes the angle $\phi$ with the perpendicular to the supporting surface of the substrate table and whereby in the second swivel position, the longitudinal axis of the swivel arm runs orthogonally to the supporting surface of the substrate table. The angle $\phi$ lies in the range of 10° to 50°, preferably in the range of 20° to 35°. This design results in an optimally short path and an imperceptible or negligible difference in height that the semiconductor chip has to overcome.

In summary, the apparatus for mounting semiconductor chips according to the present invention comprises a substrate table with a supporting surface for a substrate, a wafer table for presenting a semiconductor chip at a first location, the wafer table aligned diagonally to the supporting surface of the substrate table at a predetermined angle $\phi$ and part of the wafer table located underneath the substrate table, and a pick and place system for picking the semiconductor chip presented at the first location and placing the semiconductor chip onto the substrate, the pick and place system comprising a shuttle movable in a predetermined direction and carrying a swivel arm, whereby the shuttle is moved to a first position and the swivel arm is swivelled into a first swivel position for picking the semiconductor chip presented at the first location, whereby a longitudinal axis of the swivel arm embraces the angle φ with the perpendicular to the supporting surface of the substrate table, and whereby the shuttle is moved to another position and the swivel arm swivelled into a second swivel position for placing the semiconductor chip on the substrate, whereby the longitudinal axis of the swivel arm runs orthogonally to the supporting surface of the substrate table.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 4:
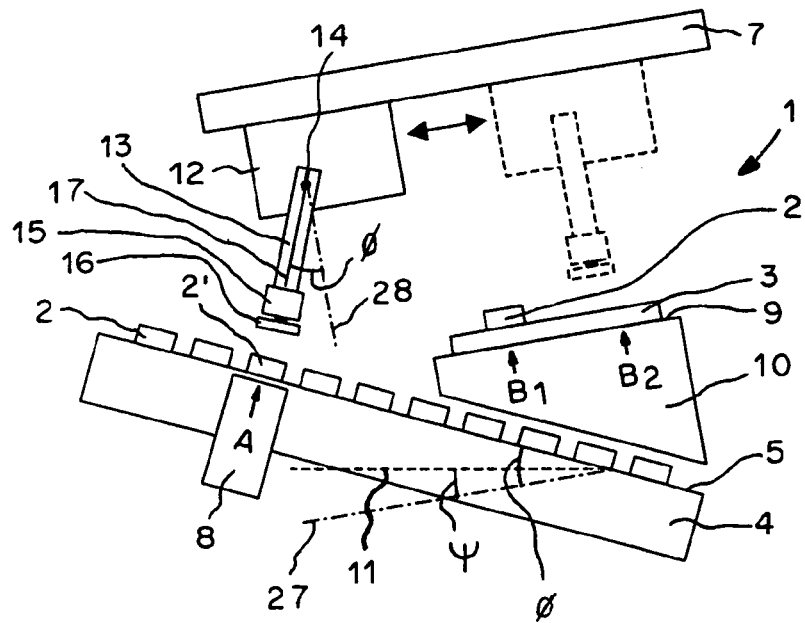
Figure 2:
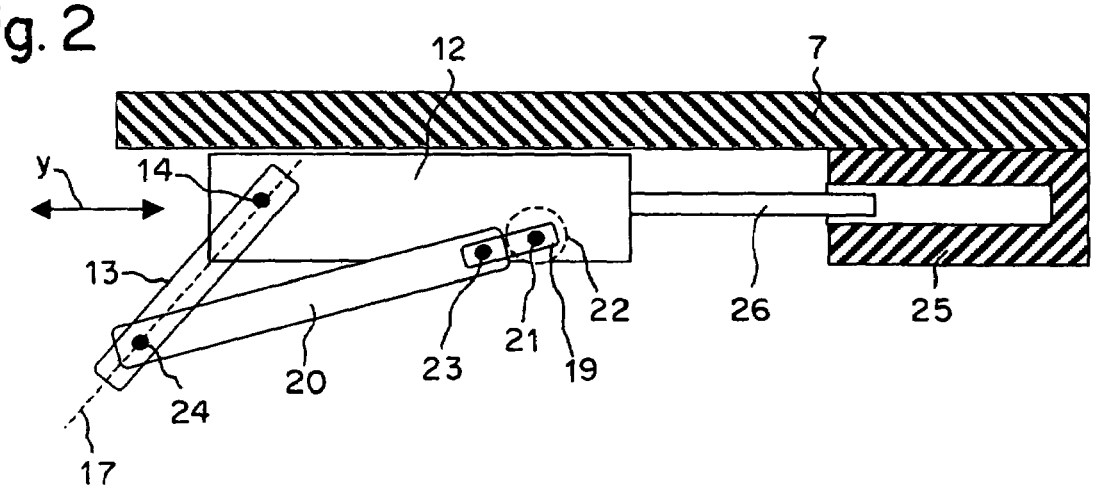
Figure 3:
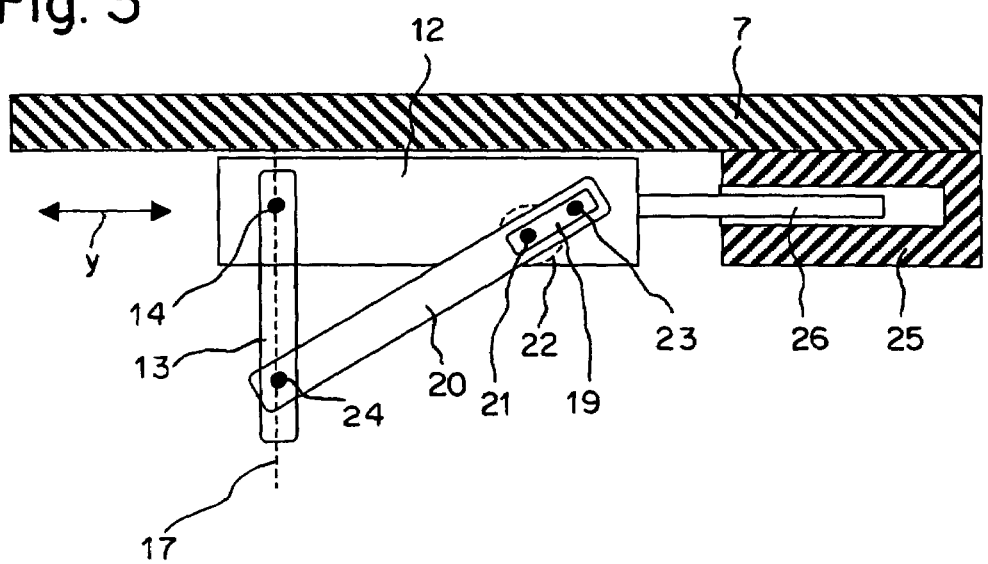

In the drawings:

FIG. 1 shows a side view of a first embodiment of the bonding station of a Die Bonder, FIGS. 2, 3 illustate details of a pick and place system in accordance with the invention, and FIG. 4 shows a side view of a second embodiment of the bonding station of a Die Bonder.

DETAILED DESCRIPTION OF THE INVENTION

FIG. 1 shows schematically a side view of an apparatus for mounting semiconductor chips, a so-called Die Bonder, as far as is necessary for the understanding of the invention. The Die Bonder comprises a (not presented) dispensing station where adhesive is applied to the substrate and a bonding station 1 where the semiconductor chips 2 are placed onto the substrate 3. The substrates 3 are transported in steps by a (not presented) transport system in a predetermined transport direction designated as x direction to the dispensing station and to the bonding station 1. The transport direction runs orthogonally to the drawing plane of FIG. 1. The semiconductor chips 2 are presented on a wafer table 4 that accommodates a wafer sawn into the individual semiconductor chips 2. The semiconductor chips 2 are arranged next to each other in rows and columns and stick to a carrier foil 5 clamped in a frame. The wafer table 4 can be moved in two orthogonal directions whereby in operation, the wafer table 4 always presents the next semiconductor chip to be placed at a fixed location A. One of the movement directions of the wafer table 4 is presented by an arrow 6, the other movement direction of the wafer table 4 runs orthogonally to the drawing plane. A pick and place system 7 serves to pick the semiconductor chip 2' presented by the wafer table 4 at location A and to place it onto the substrate 3 at a predetermined location $B_1$ or $B_2$ or . . . $B_n$ whereby the index n designates the number of substrate places that are arranged next to each other on the substrate 3. In the example, n=2. The wafer table 4 comprises a stationary arranged so-called die ejector 8 that supports detachment of the semiconductor chips 2 from the carrier foil 5.

In the bonding station 1, the substrate 3 rests on a supporting surface 9 of a substrate table 10. With this embodiment, the supporting surface 9 is aligned horizontally. The wafer table 4 is aligned diagonally to the horizontal 11 at a predetermined angle φ so that the plane formed by the carrier foil 5 also embraces the angle φ with the horizontal 11. The substrate table 10 is designed so that the wafer table 4 is partially located underneath the substrate table 10. The angle φ lies preferably in the range of 20° to 35°, however it can also be in the range of 10° to 50°.

The pick and place system 7 comprises a shuttle 12 that can be moved in a direction designated as y direction at right angles to the transport direction of the substrate 3. The shuttle 12 has a swivel arm 13 one end of which can be rotated on a rotational axis 14 running parallel to the transport direction of the substrate 3. A bondhead 15 with a chip gripper 16 is located at the opposite end of the swivel arm 13. The swivel arm 13 can be swivelled back and forth between two predetermined swivel positions. The rotary axis 14 of the swivel arm 13 runs orthogonally to the movement axis of the shuttle 12 so that the swivel arm 13 swivels back and forth in y direction. In the first swivel position, a longitudinal axis 17 of the swivel arm 13 that penetrates the rotary axis 14 runs at an angle φ to the vertical 18. In the second swivel position, the longitudinal axis 17 of the swivel arm 13 runs in the vertical direction. The chip gripper 16 can be deflected along the longitudinal axis 17 in relation to the bondhead 15. Optionally, the chip gripper 16 can be rotated on the longitudinal axis 17. In FIG. 1, the shuttle 12, the swivel arm 13, the bondhead 15 and the chip gripper 16 are presented twice: Once with solid lines in the position at which the next semiconductor chip 2' can be picked from the wafer table 4 and once with broken lines in the position at which the picked semiconductor chip is placed onto the substrate at location $B_2$.

Mounting of the semiconductor chip presented at location A takes place in accordance with the following process:

The swivel arm 13 is swivelled into its first swivel position and the shuttle 12 is moved towards a position $y_A$ at which the longitudinal axis 17 of the swivel arm 13 is aligned with the location A.

The chip gripper 16 picks the semiconductor chip presented at location A from the wafer table 4.

The swivel arm 13 is swivelled into its second swivel position and the shuttle 12 is moved towards a position $y_k$ at which the longitudinal axis 17 of the swivel arm 13 is aligned with the location $B_k$ at which the semiconductor chip 2 is to be placed onto the substrate 3. The swivel movement of the swivel arm 13 and the movement of the shuttle 12 are combined with one another.

The chip gripper 16 places the picked semiconductor chip 2 onto the substrate 3 at location $B_k$.

The Die Bonder in accordance with the invention offers the following advantages:

The transport path from the pick location A to the mounting location $B_k$ is short.

The transport path overcomes no or only a negligible difference in height as the pick location A, measured along the radius of the swivel arm 13, is located only a little above or below the supporting surface 9 of the substrate table 10. The radial height difference is determined by the angle φ, the length of the swivel arm 13 and the position of the wafer table 4. In the example, the radial height difference has been selected so low that a movement of the bondhead 15 along the longitudinal axis 17 of the swivel arm 13 of maximum ±15 mm, preferably of less than ±10 mm is sufficient in order to be able to pick the semiconductor chips at location A and to place them at location $B_k$ even with so-called "stagged die" applications where for example two or three (different) semiconductor chips are mounted on top of each other.

The swivel movement of the swivel arm 13 takes place simultaneously with the movement of the shuttle 12 from position $y_A$ to position $y_k$. For the swivel movement therefore, the maximum time is available that the shuttle 12 needs for its movement. This has a positive effect on the oscillation behaviour and the settling time of the swivel arm 13.

The short path from the pick location A to the substrate places $B_k$ enables a compact construction of the pick and place system 7 for which therefore a high mechanical rigidity can easily be achieved which, on the other hand, means a reduced susceptibility for oscillations.

FIG. 2 shows a side view of an embodiment of the pick and place system 7 with which the swivel movement of the swivel arm 13 takes place by means of a lever mechanism whereby the first and second swivel position of the swivel arm 13 are determined by extended positions of two levers 19 and 20 with respect to each other. The first lever 19 serves as a drive lever: A first end of the lever 19 is secured to a shaft 21 of a motor 22 attached to the shuttle 12, the other end of the first lever 19 is connected to a first end of the second lever 20 via a shaft 23. The second end of the second lever 20 is connected to the swivel arm 13 via a shaft 24. The motor 22 turns the first lever 19 back and forth between two end positions at which the two levers 19 and 20 are in extended positions with respect to each other. With the term "extended position" is meant that the three shafts 21, 23 and 24 lie on a straight line. The end positions of the first lever 19 are preferably defined by two stop surfaces on the shuttle 12. FIG. 2 shows the swivel arm 13 in the first swivel position at which its longitudinal axis 17 is aligned with the location A. FIG. 3 shows the swivel arm 13 in the second swivel position at which its longitudinal axis 17 runs orthogonally to the supporting surface 9 of the substrate table 10.

The movement of the shuttle 12 in the y direction is brought about by means of a motor that is preferably a conventional linear motor. The linear motor has a rigidly arranged stator 25 equipped with magnets and a coil 26 connected to the shuttle 12. The shuttle 12 slides in guide elements. The y position of the shuttle 12 is acquired and controlled by means of a position measuring and control system whereby the position measuring system preferably consists of a rigidly arranged metal or glass rule and a reading head mounted on the shuttle 12.

Many different processes are known and there are many designs of bondhead 15 and chip gripper 16 for picking the semiconductor chips from the wafer table 4 and for placing the picked semiconductor chips onto the substrate 3. As a selected example, the process known as overtravel is mentioned here with which the bondhead 15 is lowered until the chip gripper 16 is deflected in relation to the bondhead 15 whereby a predetermined pick force and bond force is produced on picking the semiconductor chip as well as on placing the semiconductor chip. A bondhead 15 with which the deflection of the chip gripper 16 in relation to the bondhead 15 is pneumatically controlled is known from the U.S. patent application No. 2003/0101576. Two operating modes are available for controlling the deflection of the chip gripper 16. In the first operating mode, the deflection of the chip gripper 9 or a value derived from it is controlled. In the second operating mode, a pressure difference is controlled that produces the pick or bond force to be applied by the chip gripper 9. The Pick and Place system 7 in accordance with the invention can be designed to work together with all these different, known bondheads.

FIG. 4 shows an embodiment with which the supporting surface 9 of the substrate table 10 is inclined towards the wafer table 4 and embraces a predetermined angle $\psi$ with the horizontal 11. (The line 27 runs parallel to the supporting surface 9 of the substrate table 10.) Therefore, the wafer table 4 only embraces the reduced angle $\phi$–$\psi$ with the horizontal 11.

Otherwise, the embodiment is essentially identical with the first embodiment and the reference numerals designate the same objects as with the first embodiment. In the first swivel position, the swivel arm 13 embraces the angle $\phi$ with the perpendicular 28 to the supporting surface 9 of the substrate table 10. In the second swivel position, the longitudinal axis 17 of the swivel arm 13 runs orthogonally to the supporting surface 9 of the substrate table 10. The Pick and Place system 7 is also inclined to the horizontal 11 by the angle $\psi$ so that the movement of the shuttle 12 runs parallel to the supporting surface 9 of the substrate table 10.

The present invention concerns the relative position and orientation of the wafer table and the Pick and Place system of a Die Bonder. It is to be understood that the present invention can be applied to Die Bonders of different kinds and which are different in many respects from the described embodiments. While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting bare semiconductor chips, comprising
    a substrate table with a supporting surface for a substrate,
    a wafer table, the wafer table aligned diagonally to the supporting surface of the substrate table at a predetermined angle, $\phi$, part of the wafer table located underneath the substrate table and the wafer table movable in two directions for presenting a bare semiconductor chip at a first location, and
    a pick and place system for picking the semiconductor chip presented at the first location and placing the semiconductor chip onto the substrate, the pick and place system comprising a shuttle movable in a predetermined direction and carrying a swivel arm and a bondhead with a chip gripper, the pick and place system further comprising a position measuring and control system for measuring and controlling the position of the shuttle along the predetermined direction, wherein the bondhead is located at an end of the swivel arm and the chip gripper is deflectable with respect to the bondhead, wherein a direction of deflection of the chip gripper is different from said predetermined direction in which the shuttle is movable, the apparatus adapted to move the shuttle along said predetermined direction to a first position and to swivel the swivel arm into a first swivel position for picking the semiconductor chip presented at the first location, wherein in said first swivel position a longitudinal axis of the swivel arm embraces the angle $\phi$ with the perpendicular to the supporting surface of the substrate table, and the apparatus adapted to move the shuttle along said predetermined direction to another position and to swivel the swivel arm into a second swivel position for placing the semiconductor chip on the substrate, wherein in said second swivel position the longitudinal axis of the swivel arm runs orthogonally to the supporting surface of the substrate table.

2. The apparatus of claim 1, wherein the angle φ lies in the range of 10° to 50°.

3. The apparatus of claim 1, wherein the angle φ lies in the range of 20° to 35°.

4. The apparatus of claim 1, wherein the first and second swivel positions of the swivel arm are determined by means of two levers lie on a straight line when the swivel arm is in the first or second swivel position.

5. The apparatus of claim 2, wherein the first and second swivel positions of the swivel arm are determined by means of two levers that lie on a straight line when the swivel arm is in the first or second swivel position.

6. The apparatus of claim 3, wherein the first and second swivel positions of the swivel arm are determined by means of two levers that lie on a straight line when the swivel arm is in the first or second swivel position.

* * * * *